(12) United States Patent
Takase

(10) Patent No.: US 6,740,190 B2
(45) Date of Patent: May 25, 2004

(54) METHOD FOR MANUFACTURING FLAT DISPLAY ELEMENT

(75) Inventor: Takeshi Takase, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 09/988,771

(22) Filed: Nov. 20, 2001

(65) Prior Publication Data

US 2002/0075438 A1 Jun. 20, 2002

(30) Foreign Application Priority Data

Dec. 18, 2000 (JP) .................................... 2000-383882
Oct. 16, 2001 (JP) .................................... 2001-318368

(51) Int. Cl.[7] .............................................. B32B 31/18
(52) U.S. Cl. ................... 156/267; 156/100; 156/107; 156/275.5; 156/275.7; 156/292; 349/153; 349/155; 349/157; 445/25; 313/506
(58) Field of Search ................... 156/100, 107, 156/108, 109, 182, 250, 253, 267, 275.5, 275.7, 292, 300, 324; 349/153, 154, 155, 156, 157; 345/38, 50, 87, 88; 445/25; 313/506, 512; 257/100

(56) References Cited

U.S. PATENT DOCUMENTS 5,410,423 A * 4/1995 Furushima et al. ......... 349/190
6,226,067 B1 * 5/2001 Nishiguchi et al. ......... 349/155
6,573,972 B2 * 6/2003 Sasaki ........................ 349/190

FOREIGN PATENT DOCUMENTS

JP 5-165037 * 6/1993 ......... G02F/1/1339

* cited by examiner

Primary Examiner—Jeff H. Aftergut
Assistant Examiner—Jessica Rossi
(74) Attorney, Agent, or Firm—Pillsbury Winthrop LLP

(57) ABSTRACT

In a method for manufacturing a flat display element, a pair of motherboards are prepared, and a display forming portion is formed on each motherboard. A sealant is located on one of the motherboards so as to surround the peripheral edge portion of the display forming portion, and end spacers for maintaining a gap between the two motherboards and a tacker covering the end spacers are located on the end portions of the motherboard. The motherboards are stuck on each other with the sealant, end spacers, and tacker between them, and the stuck motherboards are aligned with each other. After the alignment, the two motherboards are tacked to each other by curing the tacker. Thereafter, the motherboards are finally bonded to each other by curing the sealant. Then, the substrates, stuck on each other with the sealant, are cut out by cutting the motherboards outside the sealant.

12 Claims, 3 Drawing Sheets

METHOD FOR MANUFACTURING FLAT DISPLAY ELEMENT

CROSS-REFERENCE TO RELATED APPLICATIONS

This application is based upon and claims the benefit of priority from the prior Japanese Patent Applications No. 2000-383882, filed Dec. 18, 2000; and No. 2001-318368, filed Oct. 16, 2001, the entire contents of both of which are incorporated herein by reference.

BACKGROUND OF THE INVENTION

1. Field of the Invention

The present invention relates to a method for manufacturing a flat display element, and more particularly, to a method for manufacturing a flat display element in which two substrates are stuck on each other to form a display cell with a given gap between them.

2. Description of the Related Art

In recent years, flat display elements have widely been used as image display units of portable equipments for office automation, computer terminals, TV sets, etc. Usually, one such flat display element comprises a pair of electrode substrates opposed to each other across a given gap and an optical modulation layer, such as a liquid crystal, sealed between the electrode substrates. The respective peripheral edge portions of the electrode substrates are hermetically sealed with a sealant. A plurality of spacers for maintaining the fixed gap between the paired electrode substrates are arranged between the substrates.

These spacers are generally formed of a resin sphere each and are distributed at random in the display region of the electrode substrates. In a liquid crystal display device having a liquid crystal sealed in a display cell, therefore, the spacers disturb the orientation of liquid crystal molecules and the like, and their unbalanced distribution may possibly cause uneven display.

In order to obtain display images of higher quality levels, novel flat display elements have recently been developed and started to be used practically. In these flat display elements, spacer posts that are formed by patterning a photoresist or the like are arranged in non-display regions of the electrode substrates so that they serve to keep the gap between the substrates fixed.

The display cell used in one such flat display element is manufactured in the following steps. First, two mother glass plates each having a display cell forming region are prepared. A sealant and a dummy sealant are spread on the one mother glass plate so as to surround the forming region, and a tacker for preventing misalignment with the object mother glass plate is applied to end portions of the one mother glass plate.

Subsequently, the two mother glass plates are opposed to each other, and are roughly aligned by means of a plane mounter so that the shift of the pixel patterns that are opposed to one another in the display region of the flat display element is within about 5 $\mu$m. Thereafter, the two mother glass plates are pressed and stuck on each other. Then, the mother glass plates are aligned with each other to lessen the shift of the pixel patterns. Thereafter, the tacker is cured to tack the two mother glass plates to each other, and moreover, the sealant and the dummy sealant are cured.

If the two mother glass plates are stuck on each other after they are aligned by means of the plane mounter, according to the manufacturing method described above, however, the tacker inevitably collapses, thereby causing the respective end portions of the mother glass plates to adhere to each other. In aligning the mother glass plates to lessen the pixel pattern shift by means of an aligner, therefore, the mother glass plates cannot be smoothly moved with respect to each other. Thus, the alignment takes a lot of time, so that the productivity lowers.

BRIEF SUMMARY OF THE INVENTION

The present invention has been contrived in consideration of these circumstances, and its object is to provide a manufacturing method for a flat display element, in which alignment time is shortened so that productivity is improved.

In order to achieve the above object, according to an aspect of the present invention, there is provided a method for manufacturing a flat display element provided with a pair of substrates opposed to each other across a given gap and having the respective peripheral edge portions thereof stuck on each other with a sealant. This method comprises: preparing a pair of motherboards greater than the substrates; forming a display forming portion on each motherboard; locating the sealant on at least one of the motherboards so as to surround the peripheral edge portion of the display forming portion and locating, on the end portions of the motherboard, end spacers for maintaining the gap between the two motherboards and a tacker covering the end spacers; sticking the two motherboards on each other with the sealant, end spacers, and tacker between the two; aligning the two stuck motherboards with each other; tacking the two motherboards to each other by curing the tacker after the aligning; finally bonding the two motherboards to each other by curing the sealant after the tacking; and cutting the two motherboards outside the sealant after the final bonding so as to obtain the substrates.

According to another aspect of the invention, there is provided a method for manufacturing a flat display element comprising a pair of substrates opposed to each other across a given gap and including respective peripheral edge portions thereof stuck on each other with a sealant, a plurality of spacer posts provided between the substrates and maintaining the gap between the substrates, and an optical modulation layer sealed in a region surrounded by the sealant. This method comprises: preparing a pair of motherboards greater than the substrates; forming a display forming portion on each motherboard; locating the sealant on at least one of the motherboards so as to surround the peripheral edge portion of the display forming portion and locating, on end portions of the motherboard, end spacers for maintaining the gap between the two motherboards and a tacker covering the end spacers; sticking the two motherboards on each other with the sealant, end spacers, and tacker between the two; aligning the two stuck motherboards with each other; tacking the two motherboards to each other by curing the tacker after the aligning; finally bonding the two motherboards to each other by curing the sealant after the tacking; and cutting the two motherboards outside the sealant after the final bonding so as to obtain the substrates.

According to the methods for manufacturing a flat display element arranged in this manner, the respective end portions of the motherboards can be prevented from adhering to each other by means of the end spacers, so that the two motherboards can be smoothly moved with respect to each other during the alignment. Thus, the alignment time can be shortened, so that the flat display element can enjoy improved productivity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described in detail with reference to the accompanying drawings. The following is a description of a liquid crystal display element as an example of a flat display element that is manufactured by a manufacturing method according to the present embodiment.

Figure 1:
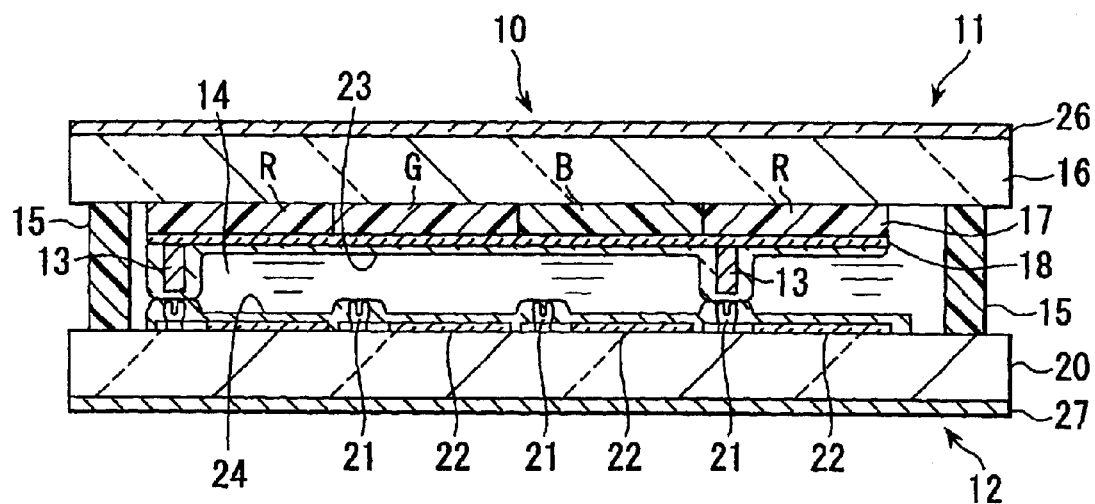
FIG. 1 is a sectional view showing a liquid crystal display element manufactured by a manufacturing method according to an embodiment of the present invention.

As shown in FIG. 1, a liquid crystal display element 10 comprises an array substrate 12 and an opposite substrate 11 that are opposed to each other across a given gap. A liquid crystal layer 14 as an optical modulation layer is sealed between the two substrates 11 and 12. The respective peripheral edge portions of the array substrate 12 and the opposite substrate 11 are hermetically sealed with a sealant 15. To keep the gap between the substrates fixed, a plurality of spacer posts 13 are arranged between the substrates 11 and 12. The substrate size and the display region size of the liquid crystal display element 10 are adjusted to 300×250× 0.7 mm and 253×190 mm, respectively.

The opposite substrate 11 is provided with a glass substrate 16 of 300×250×0.7 mm. Formed on the glass substrate 16 are a color filter layer 17 and an opposite electrode 18 that is composed of an indium-tin oxide (hereinafter referred to as ITO). The color filter layer 17 includes colored stripe layers of an acrylic resin, R (red), G (green), and B (blue), and black stripes (not shown).

The opposite substrate 11 has the spacer posts 13 of an acrylic resin, which protrude from the opposite electrode 18 toward the array substrate 12. The spacer posts 13 have a height of 5 $\mu$m and an arrangement density such that they occupy, for example, 1,000 $\mu m^2$ for each pixel area of 1 $\mu m^2$. Further, the spacer posts 13 are arranged uniformly in regions opposite to non-display regions such as wiring layer regions (not shown) of the array substrate 12. An alignment film 23 is formed on the opposite electrode 18 over the posts 13.

The spacer posts 13 may be located between the color filter layer 17 and the opposite electrode 18 or formed by stacking the colored layers of the color filter layer 17.

The array substrate 12 includes a glass substrate 20, which, like the opposite substrate 11, measures 300×250× 0.7 mm. A large number of scanning lines and signal lines are formed in a matrix on the glass substrate, and pixel electrodes 22 are provided individually in regions that are surrounded by the scanning and signal lines. Further, thin-film transistors (hereinafter referred to as TFT's) 21 for driving the liquid crystal layer 14 are arranged individually near the points of intersection of the scanning and signal lines and connected to the pixel electrodes 22. An alignment film 24 is deposited covering these lines, pixel electrodes 22, and TFT's. Polarization plates 26 and 27 are provided on the respective outer surfaces of the opposite substrate 11 and the array substrate 12, respectively.

Figure 2:
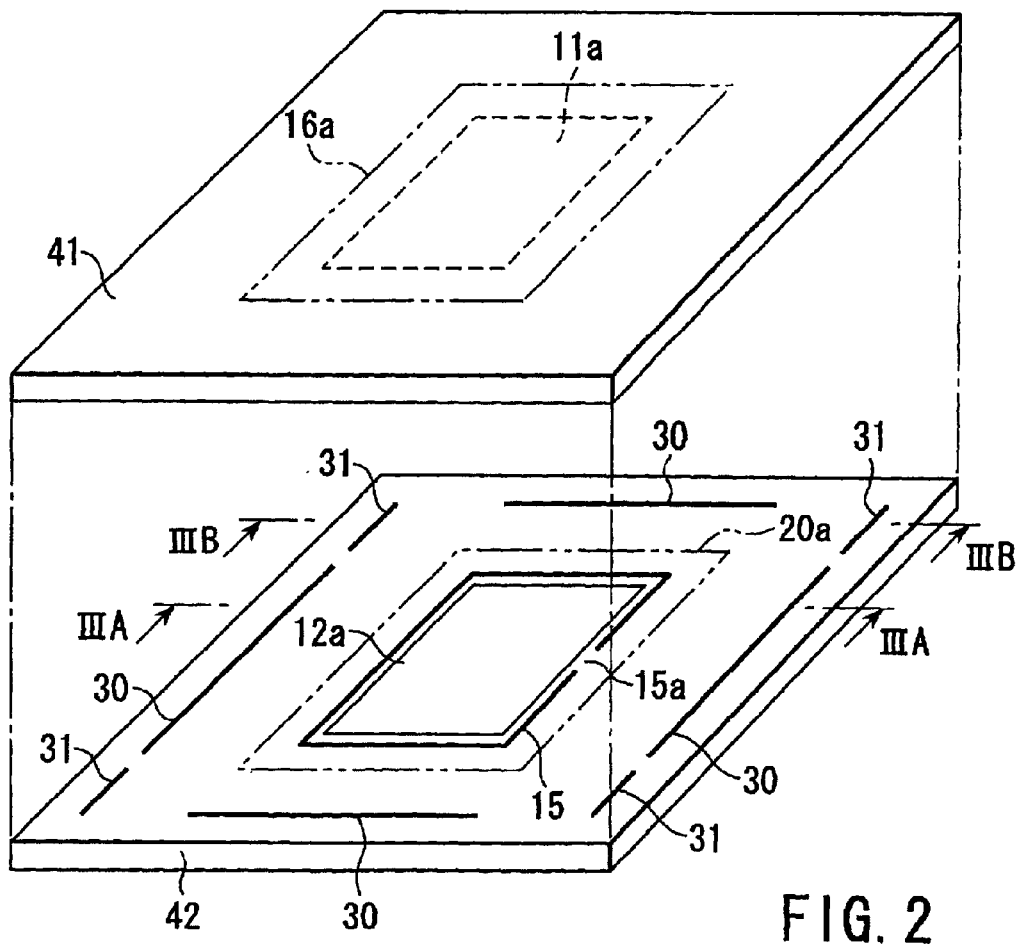
FIG. 2 is an exploded perspective view schematically showing two mother glass plates opposed to each other according to the manufacturing method of the embodiment of the invention.

The following is a description of the method for manufacturing the liquid crystal display element 10 constructed in this manner. First, rectangular mother glass plates 41 and 42 are prepared, as shown in FIG. 2. The glass plate 41 forms the glass substrate 16 of the opposite substrate 11, and the glass plate 42 forms the glass substrate 20 of the array substrate 12. These mother glass plates 41 and 42 that serve as motherboards have dimensions greater enough than those of the glass substrates 16 and 20, and measure 650×550×0.7 mm, for example.

Then, a color filter layer 17 that includes colored stripe layers R (red), G (green), and B (blue) is formed by repeating the formation of the colored layers on the mother glass plate 41 and photolithographic patterning. Subsequently, an ITO film for the opposite electrode 18 is deposited on the color filter layer 17 by sputtering. Thereafter, an acrylic resin film is deposited on the opposite electrode 18, and spacer posts 13 are formed by photolithographic patterning the acrylic resin film. After an alignment film 23 is spread over the mother glass plate 41, it is rubbed to form an opposite substrate pattern 11a as a display forming portion on the mother glass plate 41. The opposite substrate pattern 11a is formed inside a rectangular cutoff line 16a along which the glass substrate 16 is cut.

Then, scanning lines, signal lines, and TFT's 21 are formed by repeating the formation of metal layers, semiconductor layers, insulating layers, etc. on the mother glass plate 42 and photolithographic patterning. Subsequently, an ITO film is deposited on the mother glass plate 42 by sputtering and patterned by photolithography to form pixel electrodes 22 in a matrix. After an alignment film 24 is spread over the electrodes 22, moreover, it is rubbed to form an array substrate pattern 12a as a display forming portion on the mother glass plate 42. The array substrate pattern 12a is formed inside a rectangular cutoff line 20a along which the glass substrate 20 is cut.

Figure 3A:
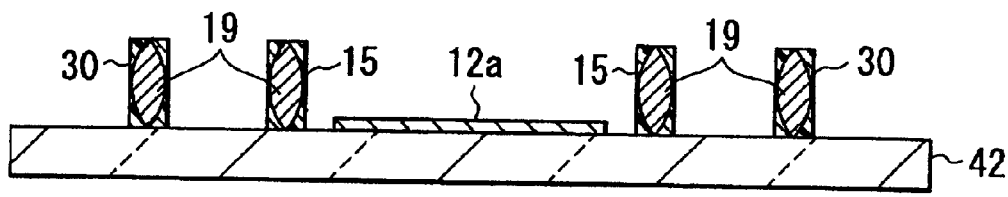
FIG. 3A is a sectional views taken along line IIIA—IIIA in FIG. 2 and showing a step of spreading a sealant and a dummy sealant.

Subsequently, a sealant 15 is spread along the peripheral edge of a display region of the array substrate pattern 12a on the mother glass plate 42, inside the cutoff line 20a, by means of a dispenser (not shown) so that the whole area of the display region except an injection hole 15a is surrounded by the sealant 15, as shown in FIGS. 2 and 3A. The sealant 15 used is formed of a thermosetting epoxy resin loaded with glass fibers 19 with a diameter of 5 μm, for example.

Then, a dummy sealant 30 that has the same composition with the sealant 15 is spread along the peripheral edge of the mother glass plate 42 outside the cutoff line 20a by means of a dispenser. The dummy sealant 30 is applied to the peripheral edge portion of the mother glass plate 42 except the corner portions.

Figure 3B:
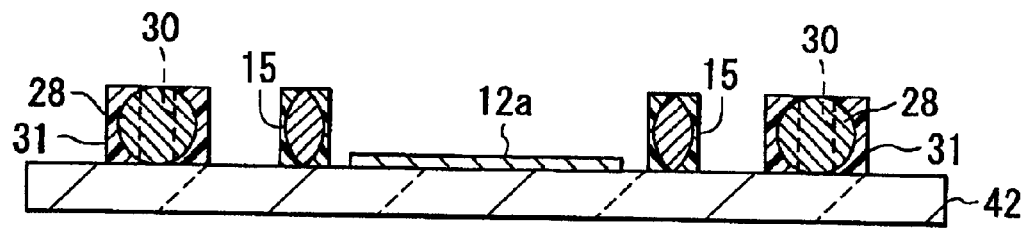
FIG. 3B is a sectional views taken along line IIIB—IIIB in FIG. 2 and showing step of spreading a tacker.

As shown in FIGS. 2 and 3B, moreover, a tacker 31 is spread straight in line with the dummy sealant 30 at the four corners of the peripheral edge portion of the mother glass plate 42. The tacker 31 used is formed of an ultraviolet-curing resin loaded with end spacers 28 or silica spheres with a diameter of 5 μm.

Figure 3C:
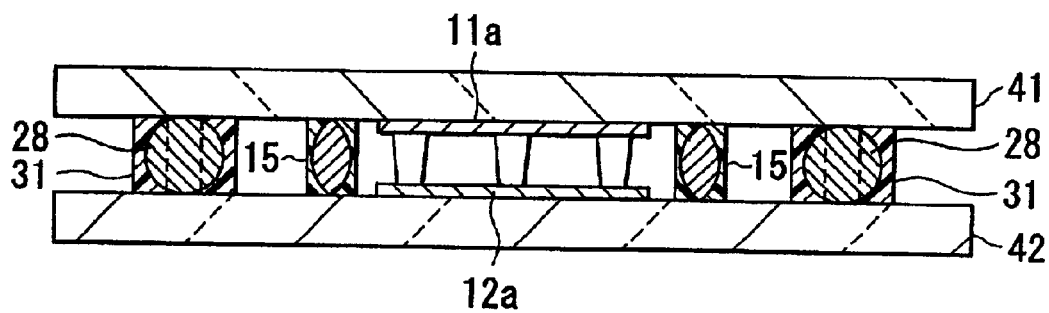
FIGS. 3C, 3D and 3E are sectional views showing a step of sticking the mother glass plates on each other, step of curing the tacker, and step of cutting out a liquid crystal cell, respectively.

Subsequently, the mother glass plates 41 and 42 are opposed to each other so that the alignment films 23 and 24 are rubbed in directions at right angles to each other. The mother glass plates 41 and 42 are roughly aligned by means of a plane mounter (not shown) so that the shift of the pixel pattern pitches of the opposite substrate pattern 11a and the array substrate pattern 12a is within 5 μm. Thereafter, the mother glass plates 41 and 42 are pressed under a pressure of 400 kgf and stuck on each other with the sealant 15, dummy sealant 30, and tacker 31, as shown in FIG. 3C.

Since the tacker 31 located in each of the four corners of the mother glass plate 42 is loaded with the end spacers 28, the mother glass plates 41 and 42 can be prevented from adhering to each other with a gap of about 5 μm maintained by means of the end spacers 28 at their peripheral edge portions.

Thereafter, the mother glass plates 41 and 42 are aligned by means of an aligner (not shown) so that the shift of the pixel pattern pitches of the opposite substrate pattern 11a and the array substrate pattern 12a is within about 5 μm. The alignment by means of the aligner required only five cycles of adjustment and about 10 seconds. Liquid crystal cells of the same size were prepared by using a tacker that is not loaded with the end spacers 28, and were aligned by means of the aligner. Thereupon, the alignment took about 50 seconds before the pattern shift was adjusted to the range of desired values.

Figure 3D:
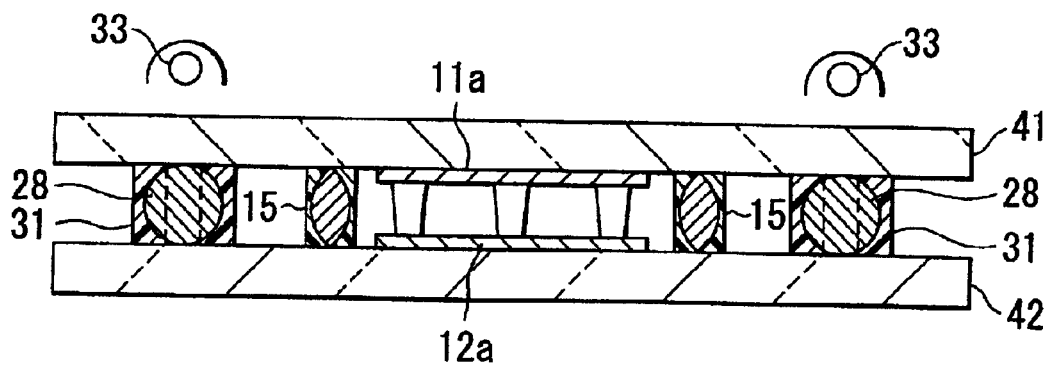
Figure 3E:
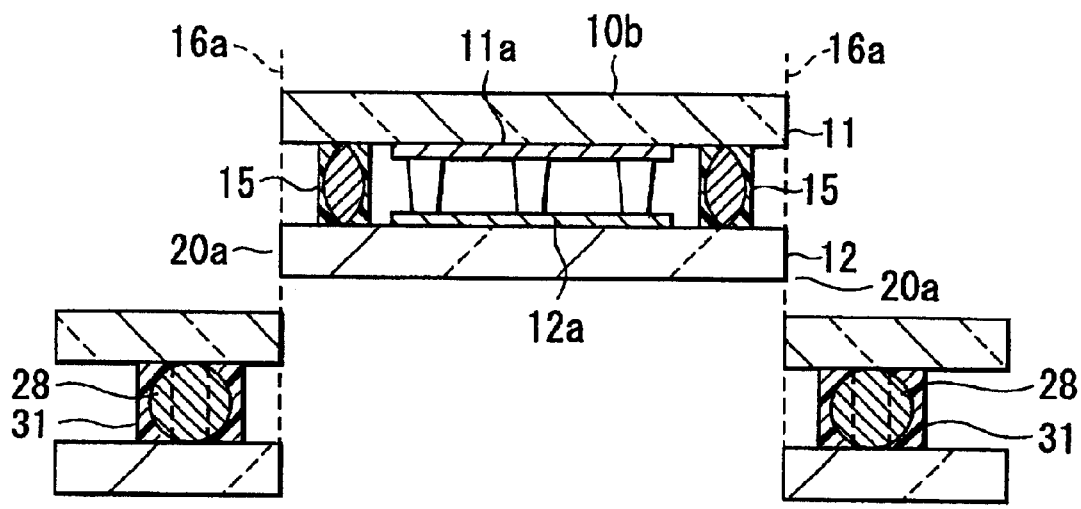

After the alignment is finished, ultraviolet rays are applied to the tacker 31 to cure it by means of mercury-vapor lamps 33, as shown in FIG. 3D, whereupon the mother glass plates 41 and 42 are tacked each other. Subsequently, the sealant 15 and the dummy sealant 30 are calcined to be cured at 150° C. for 7 hours, whereupon the mother glass plates 41 and 42 are finally bonded to each other. Then, a liquid crystal cell 10b of a desired size can be obtained by cutting the mother glass plates 41 and 42 along the cutoff lines 16a and 20a, as shown in FIG. 3E.

Subsequently, a fluorine-based liquid crystal constituent is injected into the gap between the opposite substrate 11 and the array substrate 12 through the injection hole 15a in the sealant 15 by the vacuum injection method, for example. Thereafter, the injection hole 15a is sealed with an ultraviolet-curing resin, whereupon the liquid crystal layer 14 is sealed in the gap. Then, the polarization plates 26 and 27 are stuck on the substrates 11 and 12, respectively, whereupon the display element 10 is completed.

According to the manufacturing method arranged in this manner, the tacker 31 for tacking the two opposite mother glass plates 41 and 42 is loaded with the end spacers 28 when the liquid crystal cell 10b of the liquid crystal display element 10 with the spacer posts 13 for maintaining the gap between the plates 41 and 42 is manufactured. Therefore, the gap between the mother glass plates 41 and 42 can be maintained even in the respective peripheral edge portions of the plates 41 and 42, whereby the plates 41 and 42 can be prevented from being stuck on each other. Accordingly, the mother glass plates 41 and 42 can be smoothly moved with respect to each other during the alignment, so that the alignment time, which used to be as long as about 50 seconds, can be considerably shortened to about 10 seconds. Thus, the high-display-quality liquid crystal display element 10 can enjoy improved productivity and mass production, and therefore, reduction in cost.

Figure 4A:
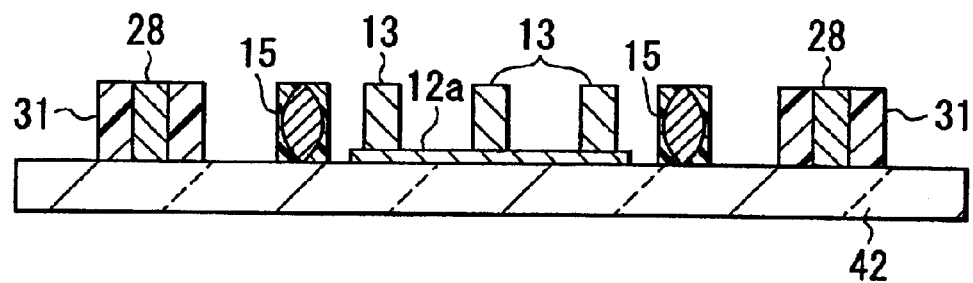
FIGS. 4A and 4B are sectional views showing a step of spreading a tacker and a step of sticking mother glass plates on each other, respectively, in a manufacturing method according to a second embodiment of the invention.
Figure 4B:
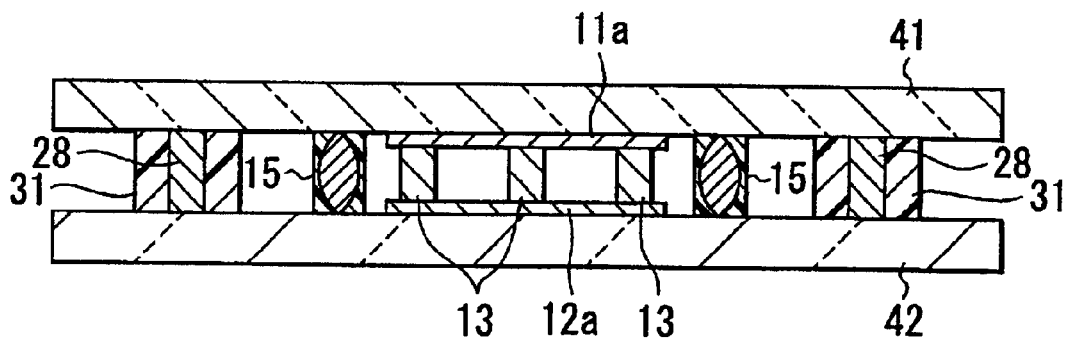

The end spacers for maintaining the gap between the respective end portions of the motherboards are not limited to the aforementioned spherical spacers, and may alternatively be pillar-shaped spacers. In this case, as shown in FIG. 4, the spacer posts 13 of the liquid crystal display element are formed on the array substrate pattern 12a of the mother glass plate 42, and at the same time, the pillar-shaped end spacers 28 are formed on the peripheral edge portion of the mother glass plate 42, e.g., in the four corners of plate 42, by patterning. The tacker 31 is spread over the end spacers 28. Thereafter, the mother glass plates 41 and 42 are stuck on each other in the same manner as in the foregoing embodiment.

An ultraviolet-curing resin is used for the tacker 31. Each end spacer 28 is in the form of a square prism having 10-μm sides and a height of 5 μm. The end spacers 28 are arranged at pitches of 100 μm, for example. For other configurations, this embodiment resembles the foregoing embodiment. Thus, the display element 10 can be manufactured in the same steps.

The same functions and effects of the foregoing embodiment can be obtained if the pillar-shaped spacers are used as the end spacers, as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, the size, distribution ratio, etc. of the spacer posts for maintaining the gap between the two substrates may be set freely, and the respective materials and properties of the sealant, dummy sealant, and tacker used may be also selected freely.

The respective sizes of the motherboards and the flat display element and the like are not limited to the values according to the foregoing embodiments. Further, a plurality of cells may be manufactured by a multi-manufacturing method in which a plurality of display element patterns are formed on each motherboard. According to the foregoing embodiments, moreover, the sealant, dummy sealant, and tacker are spread over the mother glass plate on the array-substrate side. Alternatively, however, they may be spread over the mother glass plate on the opposite-substrate side.

The present invention is applicable to the manufacture of flat display elements that have spherical spacers or no spacers, as well as to ones that have spacer posts. Further, the invention is not limited to liquid crystal display elements, and may be also applied to some other flat display elements, such as organic EL panels.

What is claimed is:

1. A method for manufacturing a flat display element provided with a pair of substrates opposed to each other across a given gap and including respective peripheral edge portions thereof stuck on each other with a sealant, comprising:

preparing a pair of motherboards larger than the substrates;

forming a display forming portion on each motherboard;

locating the sealant on at least one of the motherboards so as to surround the peripheral edge portion of the display forming portion;

locating, on end portions of the motherboard except corner portions of the motherboard, spacers for maintaining the gap between the two motherboards and a dummy sealant covering spacers, the sealant and the dummy sealant being formed individually of materials cured by the same method;

locating, on the corner portions of the motherboard, end spacers for maintaining the gap between the two motherboards and a tacker covering the end spacers, the dummy sealant and the tacker being formed individually of materials cured by different methods;

sticking the two motherboards on each other with the sealant, dummy sealant, spacers, end spacers, and tacker between the two;

aligning the two stuck motherboards with each other;

tacking the two motherboards to each other by curing the tacker after the aligning;

finally bonding the two motherboards to each other by curing the sealant and dummy sealant after the tacking; and cutting out the substrates by cutting the two motherboards outside the sealant after the final bonding.

2. A method for manufacturing a flat display element according to claim 1, wherein locating the end spacers and the tacker includes spreading the tacker loaded with the end spacers over the motherboard.

3. A method for manufacturing a flat display element according to claim 1, wherein locating the end spacers and the tacker includes forming pillar-shaped end spacers on the motherboard and then spreading the tacker over the motherboard so as to cover the end spacers.

4. A method for manufacturing a flat display element according to claim 1, wherein the end spacers and the tacker are located at least in four corners at the end portions of the motherboard.

5. A method for manufacturing a flat display element according to claim 1, wherein the sealant and the dummy sealant are each formed of a thermosetting material and the tacker is formed of an ultraviolet-curing material.

6. A method for manufacturing a flat display element comprising a pair of substrates opposed to each other across a given gap and including respective peripheral edge portions thereof stuck on each other with a sealant, a plurality of spacer posts arranged between the substrates and maintaining the gap between the substrates, and an optical modulation layer sealed in a region surrounded by the sealant, the method comprising:

preparing a pair of motherboards larger than the substrates;

forming a display forming portion on each motherboard;

locating the sealant on at least one of the motherboards so as to surround the peripheral edge portion of the display forming portion;

locating, on end portions of the motherboard except corner portions of the motherboard, spacers for maintaining the gap between the two motherboards and a dummy sealant covering spacers, the sealant and the dummy sealant being formed individually of materials cured by the same method;

locating, on the corner portions of the motherboard, end spacers for maintaining the gap between the two motherboards and a tacker covering the end spacers, the dummy sealant and the tacker being formed individually of materials cured by different methods;

sticking the two motherboards on each other with the sealant, dummy sealant, spacers, end spacers, and tacker between the two;

aligning the two stuck motherboards with each other;

tacking the two motherboards to each other by curing the tacker after the aligning;

finally bonding the two motherboards to each other by curing the sealant and dummy sealant after the tacking; and cutting out the substrates by cutting the two motherboards outside the sealant after the final bonding.

7. A method for manufacturing a flat display element according to claim 6, wherein the locating the end spacers and the tacker includes spreading the tacker loaded with the end spacers over the motherboard.

8. A method for manufacturing a flat display element according to claim 6, wherein locating the end spacers and the tacker includes forming pillar-shaped end spacers on the motherboard and then spreading the tacker over the motherboard so as to cover the end spacers.

9. A method for manufacturing a flat display element according to claim 6, wherein pillar-shaped spacers situated on the display forming portion of the one motherboard and pillar-shaped end spacers situated at the end portions of the motherboard are formed in the same step, and the tacker is spread over the motherboard so as to cover the end spacers.

10. A method for manufacturing a flat display element according to claim 6, wherein the optical modulation layer is a liquid crystal layer formed of a liquid crystal constituent.

11. A method for manufacturing a flat display element according to claim 6, wherein the sealant and the dummy sealant are formed of a thermosetting material and the tacker is formed of an ultraviolet-curing material.

12. A method for manufacturing a flat display element according to claim 6, wherein the end spacers and the tacker are located at least in the four corners at the end portions of the motherboard.

* * * * *